US012619156B2

(12) United States Patent
Jeang et al.

(10) Patent No.: US 12,619,156 B2
(45) Date of Patent: May 5, 2026

(54) EUV LIGHT UNIFORMITY CONTROL APPARATUS, EUV EXPOSURE EQUIPMENT INCLUDING THE SAME, AND METHOD OF CONTROLLING EUV LIGHT UNIFORMITY BY USING THE CONTROL APPARATUS

(71) Applicant: SAMSUNG ELECTRONICS CO., LTD., Suwon-si (KR)

(72) Inventors: Eunhee Jeang, Suwon-si (KR); Jeonggil Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 383 days.

(21) Appl. No.: 18/216,142

(22) Filed: Jun. 29, 2023

(65) Prior Publication Data

US 2024/0176247 A1 May 30, 2024

(30) Foreign Application Priority Data

Nov. 30, 2022 (KR) ........................ 10-2022-0165098

(51) Int. Cl.
*G03F 7/00* (2006.01)

(52) U.S. Cl.
CPC ...... *G03F 7/70075* (2013.01); *G03F 7/70033* (2013.01); *G03F 7/70191* (2013.01); *G03F 7/702* (2013.01)

(58) Field of Classification Search
CPC ............. G03F 7/70075; G03F 7/70033; G03F 7/70191; G03F 7/702
See application file for complete search history.

(56) References Cited

U.S. PATENT DOCUMENTS 7,030,958 B2    4/2006   Luijkx et al.
8,629,973 B2    1/2014   Zimmerman et al.
(Continued)

FOREIGN PATENT DOCUMENTS

CN          1641414 A       7/2005
KR      10-0695985 B1       3/2007
(Continued)

OTHER PUBLICATIONS

Office Action in Taiwanese Appln. No. 112127666, mailed on Sep. 10, 2025, 12 pages (with machine translation).
(Continued)

*Primary Examiner* — Georgia Y Epps
*Assistant Examiner* — Hanway Chang
(74) *Attorney, Agent, or Firm* — Fish & Richardson P.C.

(57) ABSTRACT

An extreme ultraviolet (EUV) light uniformity control apparatus includes a plurality of nano thin-films each having a band shape extending in a first direction that is a scanning direction of EUV exposure equipment and linearly arranged under a reticle of the EUV exposure equipment in a second direction that is perpendicular to the first direction. The apparatus further includes thin film mounts fixing the nano thin-films on both sides in the first direction, and a thin film control device connected to the thin film mounts and controlling the nano thin-films. EUV light from the EUV exposure equipment is projected onto a wafer that is an exposure target, after passing through the nano thin-films twice by being incident to and reflected from the reticle, and the EUV light projected on the wafer is uniformly adjusted by using the thin film control device.

20 Claims, 23 Drawing Sheets

(56)         References Cited

U.S. PATENT DOCUMENTS

| | | |
|---|---|---|
| 9,134,620 B2 | 9/2015 | Zimmerman |
| 11,163,229 B2 | 11/2021 | Mariano et al. |
| 2006/0126036 A1 | 6/2006 | Kremer et al. |
| 2006/0160031 A1* | 7/2006 | Wurm ..................... G21K 1/10 |
| | | 430/394 |
| 2020/0133142 A1 | 4/2020 | Lu et al. |
| 2021/0033982 A1 | 2/2021 | Hsu et al. |
| 2022/0214622 A1 | 7/2022 | Nath et al. |
| 2022/0276553 A1* | 9/2022 | Nikipelov ........... G03F 7/70983 |

FOREIGN PATENT DOCUMENTS

| | | |
|---|---|---|
| KR | 10-2010-0129239 A | 12/2010 |
| KR | 10-1258344 B1 | 4/2013 |
| KR | 10-2022-0005468 A | 1/2022 |
| TW | 202024770 A | 7/2020 |

OTHER PUBLICATIONS

Liu et al., "A Graphene-Based Broadband Optical Modulator," Nature, Jun. 2, 2011, 474:64-67.

* cited by examiner

EUV LIGHT UNIFORMITY CONTROL APPARATUS, EUV EXPOSURE EQUIPMENT INCLUDING THE SAME, AND METHOD OF CONTROLLING EUV LIGHT UNIFORMITY BY USING THE CONTROL APPARATUS

CROSS-REFERENCE TO RELATED APPLICATION

A claim of priority under 35 U.S.C. § 119 is made to Korean Patent Application No. 10-2022-0165098, filed on Nov. 30, 2022, in the Korean Intellectual Property Office, the disclosure of which is incorporated by reference herein in its entirety.

BACKGROUND

The inventive concept relates to extreme ultra-violet (EUV) exposure equipment, and in particular, an EUV light uniformity control apparatus capable of adjusting the uniformity of EUV light, and EUV exposure equipment that includes the control apparatus.

As line widths of a semiconductor circuit have become finer, a light source of shorter wavelength is required. For example, EUV light is used as an exposure source. Due to an absorption characteristic of EUV light, a reflective-type EUV mask is generally used in an EUV exposure process. Also, illumination optics for transferring the EUV light to an EUV mask and projection optics for projecting EUV light reflected by the EUV mask onto an exposure target may include a plurality of mirrors. Due to increased complexity of an exposure process, even a small error occurring on the EUV mask or mirrors may lead to a severe error in forming of patterns on a wafer.

SUMMARY

The inventive concept provides an extreme ultra-violet (EUV) light uniformity control apparatus capable of uniformly adjusting EUV light projected onto a wafer, EUV exposure equipment including the control apparatus, and a method of controlling EUV light uniformity by using the control apparatus.

It will be appreciated by one of ordinary skill in the art that that the objectives and effects that could be achieved with the inventive concept are not limited to what has been particularly described above and other objectives of the inventive concept will be more clearly understood from the following detailed description.

According to an aspect of the inventive concept, an extreme ultraviolet (EUV) light uniformity control apparatus is provided that includes a plurality of nano thin-films each having a band shape extending in a first direction that is a scanning direction of EUV exposure equipment and linearly arranged under a reticle of the EUV exposure equipment in a second direction that is perpendicular to the first direction. The apparatus further includes thin film mounts fixing the nano thin-films on both sides in the first direction, and a thin film control device connected to the thin film mounts and controlling the nano thin-films. EUV light from the EUV exposure equipment is projected onto a wafer that is an exposure target, after passing through the nano thin-films twice by being incident to and reflected from the reticle, and the EUV light projected on the wafer is uniformly adjusted by using the thin film control device.

According to an aspect of the inventive concept, an extreme ultraviolet (EUV) exposure equipment is provided that includes an EUV source generating and emitting EUV light, a first optical system transferring the EUV light from the EUV source to be incident on a reticle, a reticle stage on which the reticle is disposed, a second optical system transferring the EUV light reflected by the reticle to a wafer that is an exposure target, and an EUV light uniformity control apparatus that is disposed under the reticle, that includes nano thin-films through which the EUV light passes, and that adjusts the EUV light projected on the wafer.

According to an aspect of the inventive concept, an extreme ultraviolet (EUV) exposure equipment is provided that includes an EUV source generating and emitting EUV light, a first optical system transferring the EUV light from the EUV source to be incident to a reticle, a reticle stage on which the reticle is disposed, a second optical system transferring the EUV light reflected by the reticle to a wafer that is an exposure target, a wafer stage on which the wafer is disposed, and an EUV light uniformity control apparatus disposed under the reticle and adjusting uniformity of the EUV light on the wafer. The EUV light uniformity control apparatus includes a plurality of nano thin-films each having a band shape extending in a first direction that is a scanning direction of the EUV exposure equipment and linearly arranged under the reticle in a second direction that is perpendicular to the first direction, thin film mounts fixing the nano thin-films on both sides in the first direction, and a thin film control device connected to the thin film mounts and controlling the nano thin-films. The EUV light is projected onto the wafer, after passing through the nano thin-films twice by being incident on and reflected from the reticle, the EUV light uniformity control apparatus adjusts the EUV light to be uniform by using the thin film control device, the EUV light being projected on the wafer, and the thin film control device comprises at least one of a position adjusting device for moving the thin film mounts or a voltage applying device for applying voltages to the nano thin-films via the thin film mounts.

According to an aspect of the inventive concept, an extreme ultraviolet (EUV) light uniformity control method is provided that includes arranging an EUV light uniformity control apparatus including nano thin-films, through which EUV light passes, under a reticle of EUV exposure equipment, measuring an intensity of the EUV light on a wafer stage on which a wafer is disposed, analyzing uniformity of the EUV light on the wafer based on the intensity, calculating a transmittance required for the nano thin-film at a certain position under the reticle based on information about the transmittance, and controlling the nano thin-films by using the EUV light uniformity control apparatus based on the information about the transmittance.

BRIEF DESCRIPTION OF THE DRAWINGS

Embodiments will be more clearly understood from the following detailed description taken in conjunction with the accompanying drawings in which.

DETAILED DESCRIPTION OF THE EMBODIMENTS

Figure 1:
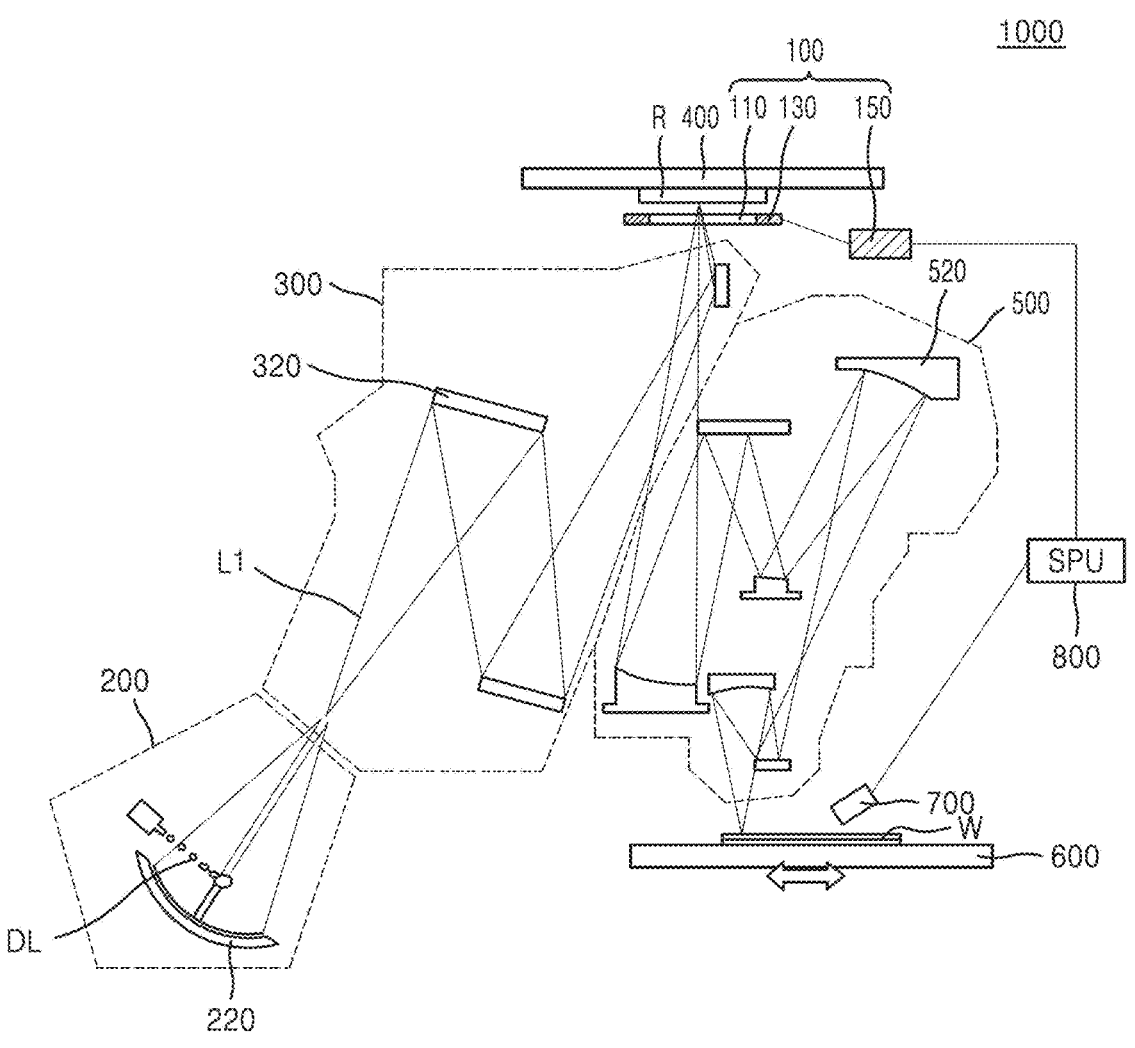
FIG. 1 is a conceptual diagram of extreme ultra-violet (EUV) exposure equipment according to an embodiment.

Hereinafter, one or more embodiments will be described in detail with reference to accompanying drawings. Like reference numerals denote the same elements on the drawings, and detailed descriptions thereof are omitted.

FIG. 1 is a conceptual diagram of extreme ultra-violet (EUV) exposure equipment 1000 according to an embodiment.

Referring to FIG. 1, the EUV exposure equipment 1000 according to the embodiment may include an EUV light uniformity control apparatus 100, an EUV source 200, a first optical system 300, a reticle stage 400, a second optical system 500, a wafer stage 600, a measurement device 700, and a signal processing unit (SPU) 800.

The EUV light uniformity control apparatus 100 is disposed below a reticle R located on the reticle stage 400, and may adjust uniformity of light projected onto a wafer W that is an EUV exposure target. The EUV light uniformity control apparatus 100 may include a nano thin-film 110, a thin film mount 130, and a thin film control device 150. Detailed descriptions of the structure and operations of the EUV light uniformity control apparatus 100 are provided below with reference to FIGS. 2A to 2C and FIGS. 8A and 8B.

The EUV source 200 may generate and output EUV light L1 of a high-energy density within a wavelength range of about 5 nm to about 50 nm. For example, the EUV source 200 may generate and output EUV light L1 of a high-energy density having a wavelength of 13.5 nm. The EUV source 200 may be a plasma-based source or a synchrotron radiation source. Here, the plasma-based source denotes a source that generates plasma and uses light emitted due to the plasma, and may include a laser-produced plasma (LPP) source, a discharge-produced plasma (DPP) source, etc. In the case of the LPP source, the EUV light may be generated from tin plasma that is generated by condensing high-power $CO_2$ laser onto tin droplets (DL).

In the EUV exposure equipment 1000 of the embodiment, the EUV source 200 may be, for example, a plasma-based source. In the EUV exposure equipment 1000 of the embodiment, the EUV source 200 is not limited to a plasma-based source. In addition, in the case of the plasma-based source, in order to increase the energy density of illumination light incident onto the first optical system 300, the plasma-based source may include a condensing mirror 220, such as an elliptical mirror and/or a spherical mirror that concentrates the EUV light. The condensing mirror 220 may be referred to as an EUV collector.

The first optical system 300 may include a plurality of mirrors 320. For example, in the EUV exposure equipment 1000 of the embodiment, the first optical system 300 may include two or three mirrors 320. However, the number of mirrors in the first optical system 300 is not limited to two or three. The first optical system 300 may transfer the EUV light L1 from the EUV source 200 to the reticle R. Here, the reticle R may denote an EUV mask. For example, the EUV light L1 from the EUV source 200 may be incident on the reticle R that is arranged on the reticle stage 400 through reflection by the mirrors 320 in the first optical system 300. In addition, the first optical system 300 may form the EUV light L1 in a curved slit shape and make the EUV light L1 be incident on the reticle R. Here, the curved slit shape of the EUV light may denote a two-dimensional curve of an arc shape on an X-Y plane. The EUV light of the curved slit shape is described in more detail below with reference to FIG. 2A, etc.

The reticle R may include a reflective-type mask having a reflective region and a non-reflective and/or intermediate-reflective region. The reticle R may include a reflective multi-layered film for reflecting EUV light and an absorbent layer pattern formed on the reflective multi-layered film, on a substrate formed of a low-thermal expansion coefficient material (LTEM), such as quartz. The reflective multi-layered film may have a structure in which molybdenum (Mo) layers and Si layers are alternately stacked to tens of layers, for example. The absorbent layer may be formed of, for example, TaN, TaNO, TaBO, Ni, Au, Ag, C, Te, Pt, Pd, Cr, etc. However, the materials in the reflective multi-layered film and materials of the absorbent layer are not limited to the above examples. Here, the region of the absorbent layer may correspond to the non-reflective and/or intermediate-reflective region. In addition, a capping layer including $ZrO_2$ may be disposed on an upper surface of the reflective multi-layered film and the absorbent layer may be disposed on the capping layer.

The reticle R reflects the EUV light L1 incident through the first optical system 300 to be incident on the second optical system 500. In more detail, the reticle R reflects the EUV light from the first optical system 300. That is, the reticle R structures the EUV light according to a pattern shape including the absorbent layer on the reflective multi-layered film and makes the EUV light be incident on the second optical system 500. The structured EUV light may be incident on the second optical system 500 while retaining information of the pattern shape on the reticle R. Also, the structured EUV light may be transferred through the second optical system 500 and then may be projected onto the EUV exposure target. Accordingly, an image corresponding to the pattern shape on the reticle R may be transferred onto the EUV exposure target. Here, the EUV exposure target may be a target including a semiconductor material, such as silicon, i.e., a wafer W. Hereinafter, unless specifically distinguished, the EUV exposure target and the wafer W may denote the same item.

The second optical system 500 may include a plurality of mirrors 520. In the EUV exposure equipment 1000 of the embodiment, the second optical system 500 may include four to eight mirrors. However, the number of mirrors in the second optical system 500 is not limited to four to eight. The second optical system 500 may transfer the EUV light reflected by the reticle R to the wafer W via reflection from the mirrors 520.

The reticle R may be disposed on the reticle stage 400. The reticle stage 400 may be moved in an x-direction and a y-direction on an x-y plane, and may be moved in a z-direction that is perpendicular to the x-y plane. Also, the reticle stage 400 may rotate about a z-axis, an x-axis, or y-axis. Through the movement and rotation of the reticle stage 400, the reticle R may be moved in the x-direction, the y-direction, or z-direction and may be rotated about the x-axis, y-axis, or z-axis.

In addition, the reticle R may be fixed to the reticle stage 400 by an electrostatic force or vacuum suction. Accordingly, the reticle stage 400 may include components corresponding to an electrostatic chuck or a vacuum chuck.

The wafer W, that is, the EUV exposure target, may be disposed on the wafer stage 600. The wafer stage 600 may be moved in the x-direction and the y-direction on the x-y plane, and may be moved in the z-direction that is perpendicular to the x-y plane. Also, the wafer stage 600 may rotate about a z-axis, an x-axis, or y-axis. Through the movement and rotation of the wafer stage 600, the wafer W may be moved in the x-direction, the y-direction, or z-direction and may be rotated about the x-axis, y-axis, or z-axis.

The measurement device 700 may measure an intensity of the EUV light above the wafer stage 600. The measurement device 700 may include an optical sensor capable of sensing the EUV light. The measurement device 700 may include a plurality of optical sensors and may measure the intensity of the EUV light in a certain region on the wafer stage 600. In an example, optical sensors may be arranged at certain intervals in a direction in which the slit expands so as to correspond to the EUV light in the curved slit shape, and then, the intensity of the EUV light at each position in the certain region on the wafer stage 600 may be measured. Also, the intensity of the EUV light in the certain region may be measured by using one optical sensor while moving the wafer stage 600 in one direction. Moreover, the intensity of the EUV light of the entire region, including the region where the EUV light is projected, may be measured by using the measurement device 700 that is relatively large in size, in which a plurality of optical sensors are arranged in a two-dimensional array, and then, the intensity of the EUV light of a certain region may be extracted.

The SPU 800 analyzes uniformity of the EUV light based on the intensity of the EUV light measured by the measurement device 700. Also, based on information regarding the uniformity of the EUV light, a transmittance required for the nano thin-film 110 of the EUV light uniformity control apparatus 100 is calculated. Also, the SPU 800 may transfer a control signal to the EUV light uniformity control apparatus 100 based on the calculated transmittance. Here, the control signal may vary depending on a kind of the thin film control device 150 of the EUV light uniformity control apparatus 100. For example, when the thin film control device 150 includes a position adjusting device (see 150a of FIG. 8A), the control signal may include a signal indicative of positional information of the nano thin-film 110. Also, when the thin film control device 150 includes a voltage applying device (see 150b of FIG. 8B), the control signal may include a signal indicative of a magnitude of a voltage that is to be applied to the nano thin-film 110. The control of the nano thin-film 110 according to the kind of the thin film control device 150 is described in more detail below with reference to FIGS. 8A and 8B.

The EUV exposure equipment 1000 of the embodiment may include the EUV light uniformity control apparatus 100 disposed below the reticle R. Also, the EUV light uniformity control apparatus 100 may adjust the transmittance of the EUV light that is incident on and reflected from the reticle R by using the nano thin-film 110. Therefore, the EUV exposure equipment 1000 of the embodiment may optimally adjust the uniformity of the EUV light that is projected onto the wafer W, that is, the EUV exposure target. Here, the uniformity of the EUV light may denote a uniformity in the intensity of the EUV light throughout a certain region. Also, the certain region may denote a region on the wafer W, which corresponds to the EUV light formed in the curved slit.

In addition, the EUV exposure equipment 1000 of the embodiment may address issues, such as severe loss in the power of the EUV light or deformation of the EUV light that is formed in the curved slit shape, etc., by adjusting the uniformity of the EUV light by using the EUV light uniformity control apparatus 100 including nano thin-films. Therefore, the EUV exposure equipment 1000 of the embodiment may increase the processing speed and productivity of the EUV exposure process and improve reliability. The above issues, e.g., the severe loss in the power of the EUV light, deformation of the EUV light in the curved slit shape, etc. are generated in EUV light uniformity control apparatus according to a comparative example, as described in detail below with reference to FIGS. 3A to 4B.

Figure 2A:
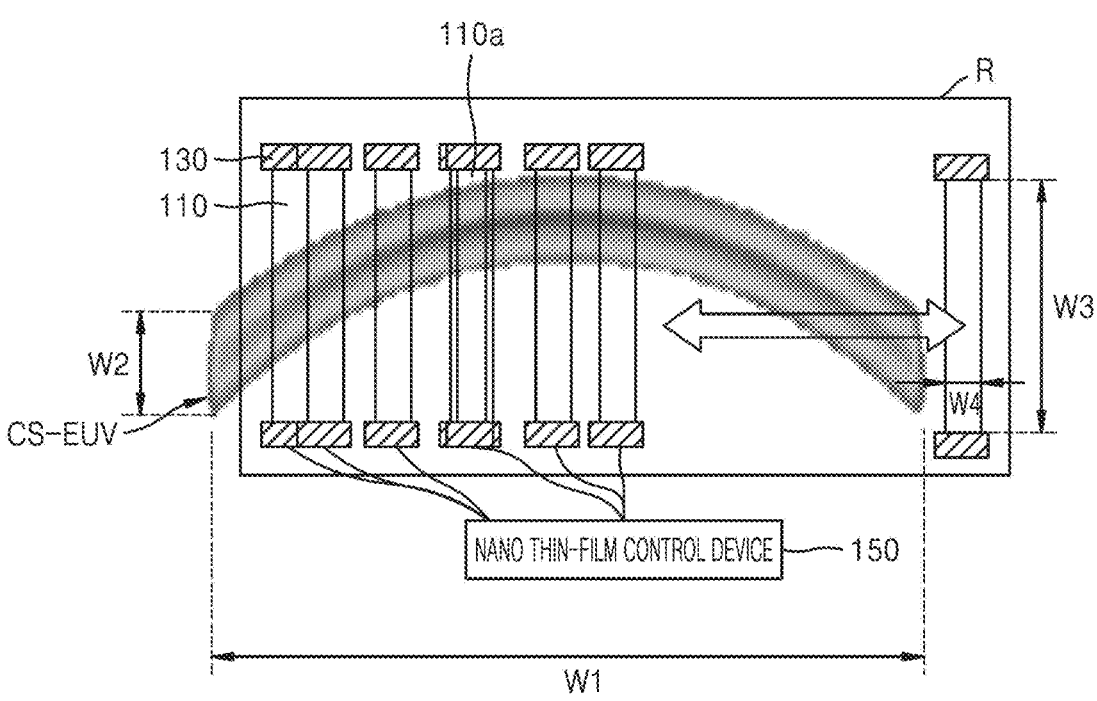
FIGS. 2A to 2C are a plan view and side views schematically showing an EUV light uniformity control apparatus according to an embodiment.
Figure 2B:
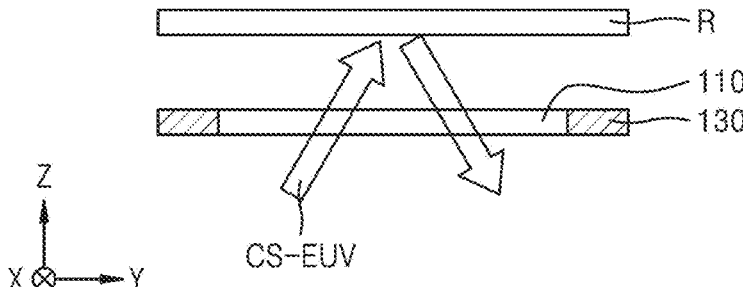
Figure 2C:
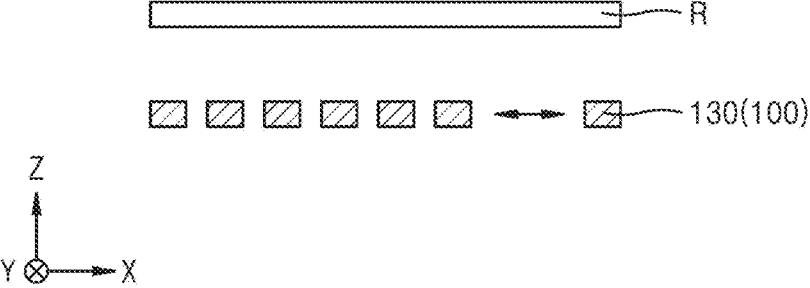

FIGS. 2A to 2C are a plan view and side views schematically showing the EUV light uniformity control apparatus according to an embodiment. FIG. 2A is a plan view showing a lower surface of the reticle R, FIG. 2B is a side view seen in the x-direction perpendicular to a scanning direction, and FIG. 2C is a side view in the y-direction that is the scanning direction. Reference is additionally made to FIG. 1, but the detailed descriptions already provided above with reference to FIG. 1 are briefly provided or omitted to avoid redundancy.

Referring to FIGS. 2A to 2C, the EUV light uniformity control apparatus 100 of the embodiment may include the nano thin-film 110, the thin film mount 130, and the thin film control device 150.

The nano thin-film 110 may be formed of a material capable of transmitting the EUV light. For example, the nano thin-film 110 may be formed of a material having an EUV light transmittance of 80% or greater with a thickness of about 1 to a few nm. In more detail, the nano thin-film 110 may include one of silicon (Si), silicon carbide (SiC), silicon nitride (SiNx), and a carbon-based material. However, the material included in the nano thin-film 110 is not limited to the above example. In other words, provided that the condition, in which the EUV light transmittance is 80% or greater with the thickness of about 1 to a few nm, is satisfied, the nano thin-film 110 may include any other material than the materials stated above. In addition, the carbon-based material may include, for example, graphene, carbon-nanotubes, etc.

In FIG. 2A, EUV light CS-EUV of the curved slit shape is shown on the reticle R. Shades in black and white of the EUV light CS-EUV denote intensity, and the central black part denotes a high intensity region and peripheral black portions denote low intensity regions. When the intensity is expressed in colors, that is, red color denotes high intensity and purple color denotes low intensity, the central black portion of the EUV light CS-EUV in FIG. 2A may correspond to red and the peripheral black may correspond to navy.

In addition, the EUV light CS-EUV generally has a first width W1 of about 104 mm in the x-direction and a second width W2 of about 32 mm in the y-direction, on the reticle R. Here, the y-direction may correspond to a direction in which scanning is performed in the EUV exposure equipment 1000, that is, the scanning direction.

The nano thin-film 110 may have an area that may partially cover the EUV light CS-EUV under the lower surface of the reticle R. In detail, the nano thin-film 110 may have a width that may totally cover the EUV light CS-EUV in the y-direction. Accordingly, the nano thin-film 110 may have a third width W3 of about 40 mm in the y-direction. Also, when the nano thin-film 110 is fixed without moving in the y-direction and transmits the EUV light CS-EUV, the third width W3 of the nano thin-film 110 may be about 70 mm to correspond to the curved slit shape of the EUV light CS-EUV. When a maximum value of the third width W3 of the nano thin-film 110 is about 100 mm, the third width W3 of the nano thin-film 110 may be, for example, in a range of about 40 mm to about 100 mm.

In addition, a fourth width W4 of the nano thin-film 110 in the x-direction may vary depending on the number of nano thin-films 110 arranged in the x-direction. In other words, when tens of nano thin-films 110 are arranged in the x-direction in order to finely adjust the uniformity of the EUV light CS-EUV, the fourth width W4 of the nano thin-film 110 may be reduced to about a few mm. On the contrary, when less than ten nano thin-films 110 are arranged in the x-direction, the fourth width W4 of the nano thin-film 110 may be about 10 mm or greater. In the EUV light uniformity control apparatus 100 of the embodiment, when about ten nano thin-films 110 are arranged in the x-direction, the fourth width W4 of the nano thin-film 110 may be in a range of about 1 mm to about 15 mm.

However, the third width W3 and the fourth width W4 of the nano thin-film 110 are not limited to the numerical ranges described above. For example, the nano thin-film 110 may have a size other than the numerical range stated above, provided that the nano-thin film 110 covers the total width of the EUV light CS-EUV in the y-direction and at least partially covers the EUV light CS-EUV in the x-direction. Here, the size of the nano thin-film 110 may denote an area of the region, through which the EUV light CS-EUV actually transmits, minus the portion covered by the thin film mount 130. The surface of the reticle R shown in FIG. 2A may correspond to the lower surface of the reticle R in FIGS. 2B and 2C. Therefore, the reticle R may be below the nano thin-film 110 in FIG. 2A.

As shown in FIGS. 2A and 2C, the plurality of nano thin-films 110 may be arranged under the reticle R. Also, the plurality of nano thin-films 110 may have the same transmittance or at least one of the nano thin-films 110 may have a different transmittance. For example, in the EUV light uniformity control apparatus 100 of the embodiment, the nano thin-film 110 may have a transmittance of about 80% to about 99%. However, the transmittance that the nano thin-film 110 may have is not limited to the above numerical range.

For example, when nano thin-films 110 have transmittances of 95%, 90%, and 80% and one of the transmittances is necessary at a certain region under the reticle R, the nano thin-film 110 corresponding to the transmittance may be arranged. Also, when a transmittance other than the above transmittance examples is necessary, the required transmittance may be implemented by overlapping the nano thin-films 110. For example, when a transmittance of about 60% is required, two nano thin-films 110 having a transmittance of about 80% overlap and a transmittance close to 60% (=0.8*0.8=0.64) may be implemented. In FIG. 2A, reference numerals 110a denotes a state in which two nano thin-films 110 overlap.

A nano thin-film having a transmittance of 95% or greater is described below. When it is assumed that there is no loss in the reticle R and the second optical system 500, the EUV light (CS-EUV) proceeds toward the wafer W after passing through the nano thin-film 110 twice, and thus, an intensity of 90% or greater (=0.95*0.95=0.903) may be obtained by using a nano thin-film of 95% or greater. In addition, because it is generally difficult to make the uniformity of light 90% or greater, the nano thin-film having a transmittance of 95% or greater may be unnecessary.

The thin film mount 130 may tightly fix the nano thin-film 110 by holding both sides of the nano thin-film 110 in the y-direction. In some embodiments, the thin film mount has a cooling device built therein. The thin film mount 130 may move each of the nano thin-films 110 in the x-direction and y-direction. Accordingly, in the EUV light uniformity control apparatus 100 of the embodiment, the number of thin film mounts 130 may correspond to the number of nano thin-films 110. Here, thin film mounts at both sides of one nano thin-film 110 are counted as one thin film mount.

In some embodiments, the thin film mount 130 may move the nano thin-film 110 only in the x-direction. Also, in some embodiments, the thin film mount 130 may not move. In the embodiment in which the thin film mount 130 does not move, the nano thin-films 110 are arranged to entirely cover the EUV light CS-EUV and the transmittance may be changed through electromagnetic control, i.e., adjusting a voltage. The above embodiment is described in detail below with reference to FIG. 8B.

In addition, two thin film mounts 130 may be moved in the x-direction and overlap each other. Accordingly, the two nano thin-films 110 fixed by the two thin film mounts 130 may overlap each other. According to the embodiment, three or more thin film mounts 130 may overlap one another, and accordingly, three or more nano thin-films 110 may overlap one another.

The thin film control device 150 may be connected to the thin film mount 130 to control the nano thin-film 110. The control of the nano thin-film 110 via the thin film control device 150 may include a position control of the nano thin-film 110 and a transmittance control of the nano thin-film 110. The position control of the nano thin-film 110 may denote that the position of the nano thin-film 110 having a fixed transmittance is moved. On the contrary, the transmittance control of the nano thin-film 110 may denote the changing of the transmittance of the nano thin-film 110, the position of which is fixed. The position control of the nano thin-film 110 by the thin film control device 150 is described in more detail below with reference to FIG. 8A, and the transmittance control of the nano thin-film 110 by the thin film control device 150 is described in more detail below with reference to FIG. 8B.

As described above, when the transmittance of the EUV light under the reticle R is adjusted by controlling the nano thin-films 110 by using the thin film control device 150, the intensity at a certain region of the corresponding wafer may be adjusted. In more detail, for example, it is assumed that the region on the wafer corresponding to the EUV light formed in the curved slit shape is divided into five regions in the x-direction, a second region has the highest intensity, a fifth region has the second highest intensity, and first, third, and fourth regions are next and have similar intensities. Accordingly, a nano thin-film 110 having a first transmittance may be arranged at a position under the reticle R, which corresponds to the second region, or the transmittance of the nano thin-film 110 may be adjusted to be the first transmittance. Thus, the intensity of the second region is similar to the intensity of the first region. Also, the nano thin-film 110 having a second transmittance that is greater than the first transmittance may be arranged at a position under the reticle R, which corresponds to the fifth region, or the transmittance of the nano thin-film 110 may be adjusted to be the second transmittance, so that the intensity of the fifth region may be similar to the intensity of the first region. Consequently, the intensities of the five regions are made similar to one another, and thus, the uniformity of the EUV light on the wafer W may be improved.

Figure 3A:
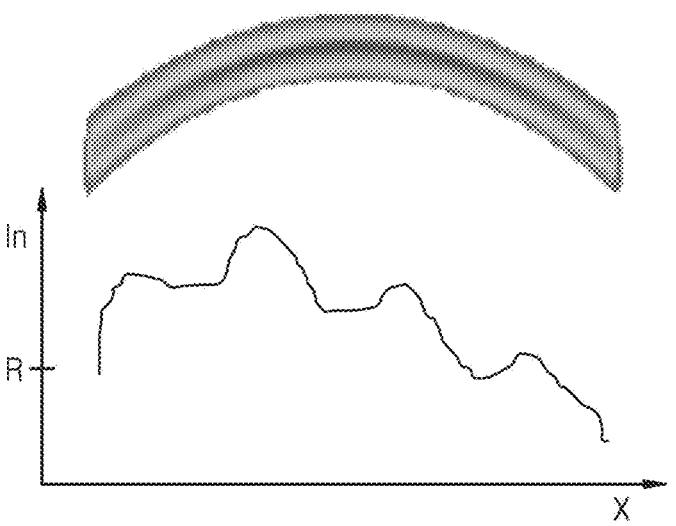
FIGS. 3A to 3C are conceptual diagrams for describing non-uniformity of EUV light before uniformity adjustment, uniformity adjustment by using EUV light uniformity control apparatus according to a comparative example, and uniformity adjustment by using EUV light uniformity control apparatus according to the embodiment.
Figure 3B:
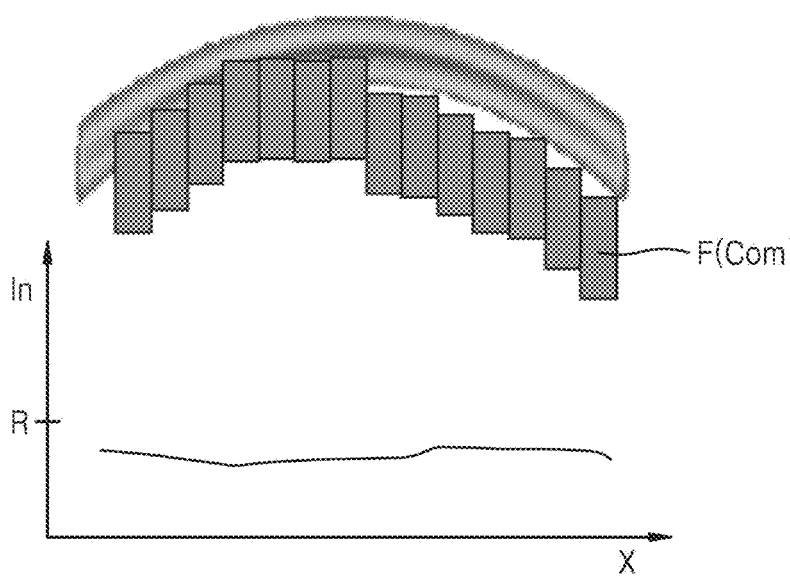
Figure 3C:
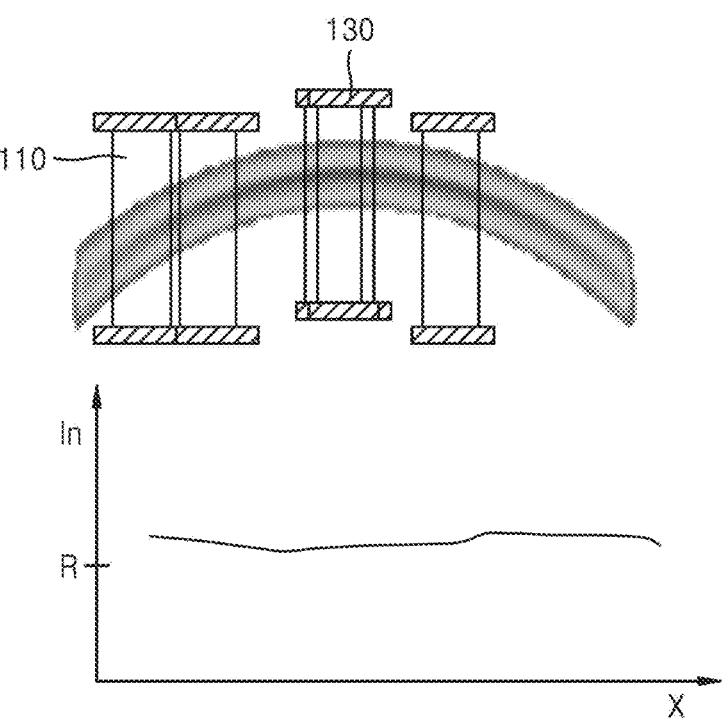

FIGS. 3A to 3C are conceptual diagrams for describing non-uniformity of EUV light before uniformity adjustment, uniformity adjustment by using EUV light uniformity control apparatus according to a comparative example, and uniformity adjustment by using EUV light uniformity control apparatus according to the embodiment. The EUV light formed in the curved slit shape on the reticle is shown in the upper portion of each of the drawings, and an intensity graph on the corresponding wafer is shown in the lower portion of each drawing. Also, in each graph, the x-axis denotes a position in the x-direction and the y-axis denotes an intensity of the EUV light on the wafer.

Referring to FIG. 3A, as represented by the graph at the lower side, the intensity of the EUV light on the wafer largely fluctuates in the x-direction before adjusting the uniformity. That is, the uniformity of the EUV light on the wafer may be very low before adjusting the uniformity. Here, R may correspond to a reference intensity of the EUV light required in the exposure process.

Referring to FIG. 3B, an EUV light uniformity control apparatus Com according to the comparative example adjusts the uniformity by blocking the EUV light incident on the reticle R by using fingers F. As shown in the graph at the lower side of the drawing, the intensity of the EUV light on the wafer is shown to be maintained constant in the x-direction. Therefore, after adjusting the uniformity by using the EUV light uniformity control apparatus Com of the comparative example, the uniformity of the EUV light on the wafer may be greatly improved. However, the intensity of the EUV light is generally lowered to a reference intensity or less, and thus, the reliability of the exposure process may degrade.

The EUV light uniformity control apparatus Com of the comparative example includes 28 fingers F, and each of the fingers F screens the EUV light on the portion having high intensity so that a uniformity value of the light of the curved slit shape transferred to the reticle R may be adjusted. Here, the uniformity value may be defined as (Imax− Imin)/(Imax+Imin). Imax denotes a maximum value of the intensity and Imin denotes a minimum value of the intensity. As the uniformity value decreases, the uniformity may be evaluated to be high.

In addition, in recent EUV exposure equipment, the biggest bottleneck factor in producing products may be power shortage. Securing a source of sufficient power in EUV exposure equipment is difficult, compared to existing exposure equipment, such as deep ultraviolet (DUV) exposure, and thus, a small loss in power may largely affect productivity. In the EUV light uniformity control apparatus Com of the comparative example, the physical shield using the fingers F is of a binary type, and thus, the transmittance of 100% is turned into 0%. This leads to a large power loss in the EUV light. Also, as described below with reference to FIG. 4A, the physical shield using the fingers F may distort the curved slit shape of the EUV light. The power loss and the distorted shape of the EUV light may generate a region that lacks exposure amount spatially during the exposure process on the wafer, which may cause a re-exposure, re-work, etc. In particular, when the uniformity is adjusted by the EUV light uniformity control apparatus Com of the comparative example, the shape of the EUV light may vary in each piece of EUV exposure equipment. For example, the re-exposure may denote that the exposure is re-performed to the same PR, and the re-work may denote that the existing PR is removed and a new PR is formed to perform the exposure.

Referring to FIG. 3C, the EUV light uniformity control apparatus 100 according to the embodiment may adjust the uniformity while transmitting the EUV light incident on the reticle R by using the nano thin-films 110. As shown in the graph at the lower side of the drawing, the intensity of the EUV light on the wafer is shown to be maintained constant in the x-direction. Therefore, it is shown that the uniformity of the EUV light on the wafer is greatly improved after adjusting the uniformity by using the EUV light uniformity control apparatus 100 of the embodiment. Also, the intensity of the EUV light is not greatly reduced, and thus, the intensity may be maintained at a level higher than the reference intensity. Therefore, the reliability of the exposure process may be improved. Moreover, because the curved slit shape of the EUV light is maintained, the scanning may be evenly performed on the wafer.

When the power losses in the EUV light uniformity control apparatus Com of the comparative example and in the EUV light uniformity control apparatus 100 of the embodiment are numerically compared with each other, the power may be reduced by 100% when the fingers screen the EUV light in the EUV light uniformity control apparatus Com of the comparative example. Compared to the above, when the nano thin-film 110 having the transmittance of 90% is used in the EUV light uniformity control apparatus 100 according to the embodiment, a power loss of about 20% (10% (incident)+10% (exit)=20%, or 0.9*0.9=0.81) is generated. Therefore, when the EUV light uniformity control apparatus 100 of the embodiment is used, the power loss may be reduced from 100% to 20%.

Figure 4A:
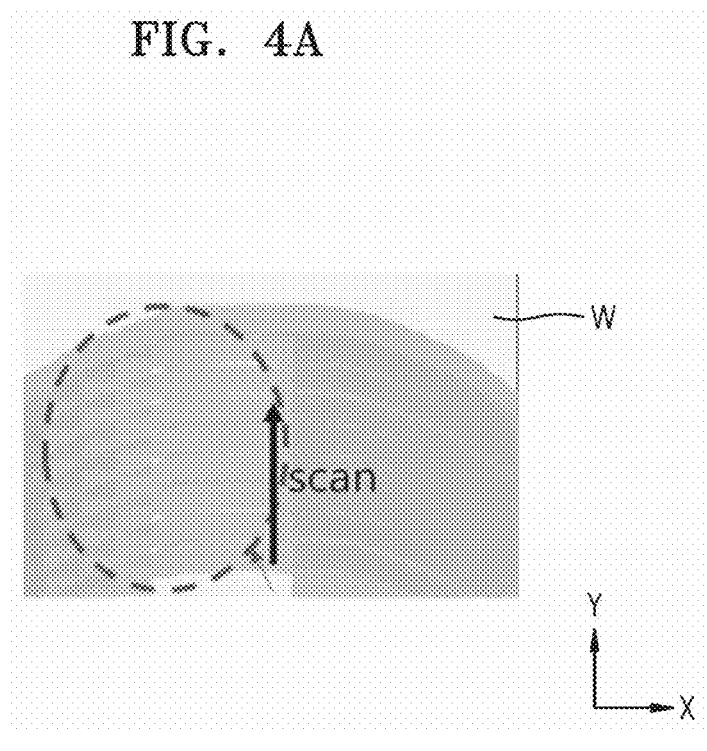
FIGS. 4A and 4B are simulation photographs showing EUV light states on wafers according to the uniformity adjustment using the EUV light uniformity control apparatus according to the comparative example and the uniformity adjustment using the EUV light uniformity control apparatus of the embodiment.
Figure 4B:
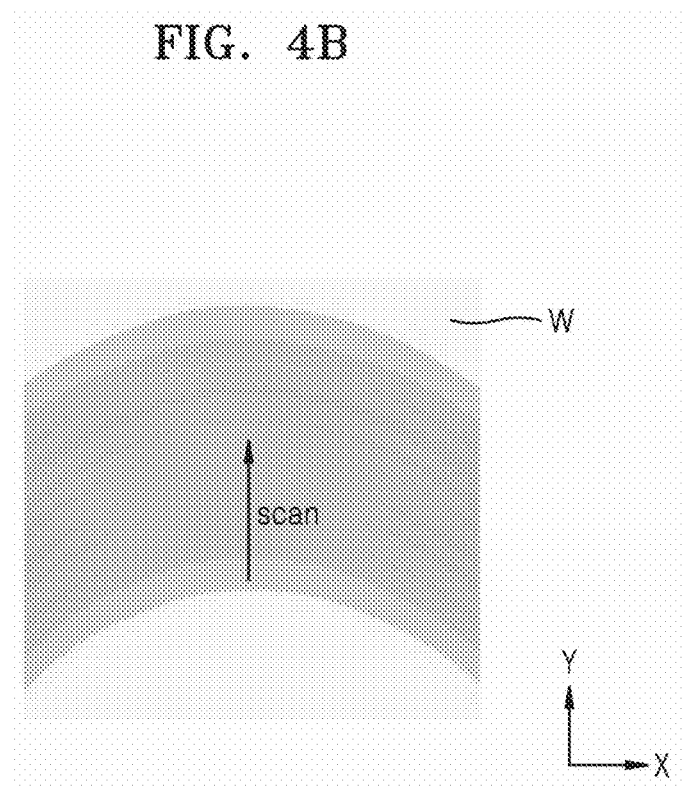

FIGS. 4A and 4B are simulation photographs showing EUV light states on wafers according to the uniformity adjustment using the EUV light uniformity control apparatus according to the comparative example and the uniformity adjustment using the EUV light uniformity control apparatus of the embodiment.

Referring to FIGS. 4A and 4B, the region indicated by the dashed line in FIG. 4A may correspond to the portion screened by the fingers F in the EUV light uniformity control apparatus Com according to the comparative example. As shown in FIG. 4A, the distorted shape of EUV light is expressed in the region indicated by the dashed line on the wafer W.

On the contrary, in FIG. 4B, it may be identified that there is no distortion in the EUV light. Consequently, in the case of the uniformity adjustment using the EUV light uniformity control apparatus 100 of the embodiment, the curved slit shape of the EUV light may be maintained on the wafer W without any distortion.

Figure 5A:
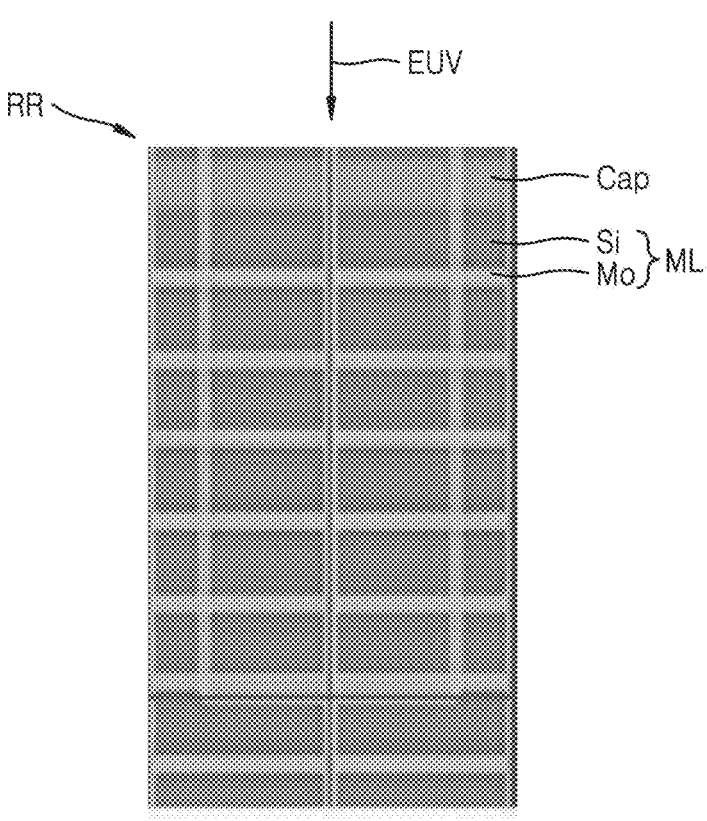
FIGS. 5A and 5B are graphs showing a reference reticle having a surface roughness of 0 nm and an EUV light measurement result.
Figure 5B:
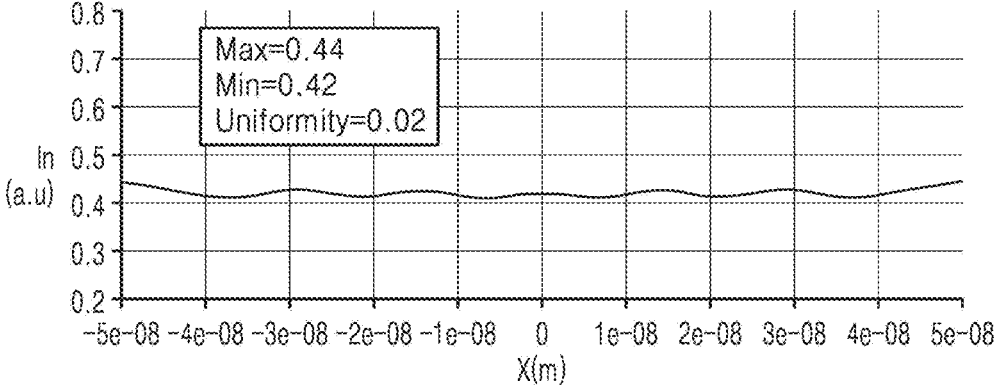

FIGS. 5A and 5B are graphs showing a reference reticle having a surface roughness of 0 nm and an EUV light measurement result. In FIG. 5B, an x-axis denotes a position in units of m, and a y-axis denotes an intensity in arbitrary unit (a.u.).

Referring to FIGS. 5A and 5B, a reference reticle RR may include a silicon (Si) substrate, a multiple layer ML including Mo/Si, and a capping layer Cap including $ZrO_2$. In FIG. 5A, the Si substrate is not shown, and the multiple layer ML and the capping layer Cap are only shown. Also, because the surface roughness is 0 nm, there may be no distortion in the multiple layer ML and the capping layer Cap.

FIG. 5B is an intensity graph obtained by irradiating the EUV light (EUV) onto the reference reticle RR of FIG. 5A and measuring the EUV light (EUV) reflected by the reference reticle RR, and a uniformity value is very low about 0.02. That is, it may be determined that the uniformity of the EUV light reflected by the reference reticle RR may be very high.

Figure 6A:
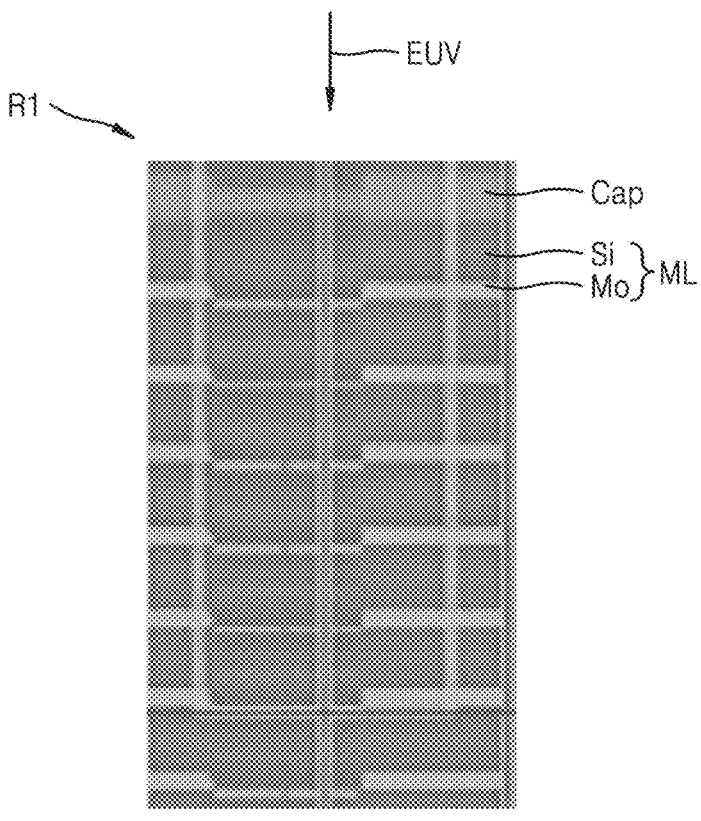
FIGS. 6A to 6D are graphs showing a first reticle having a surface roughness of 0.2 nm and an EUV light measurement result, a first reticle having a nano thin-film disposed thereon, and an EUV light measurement result.
Figure 6B:
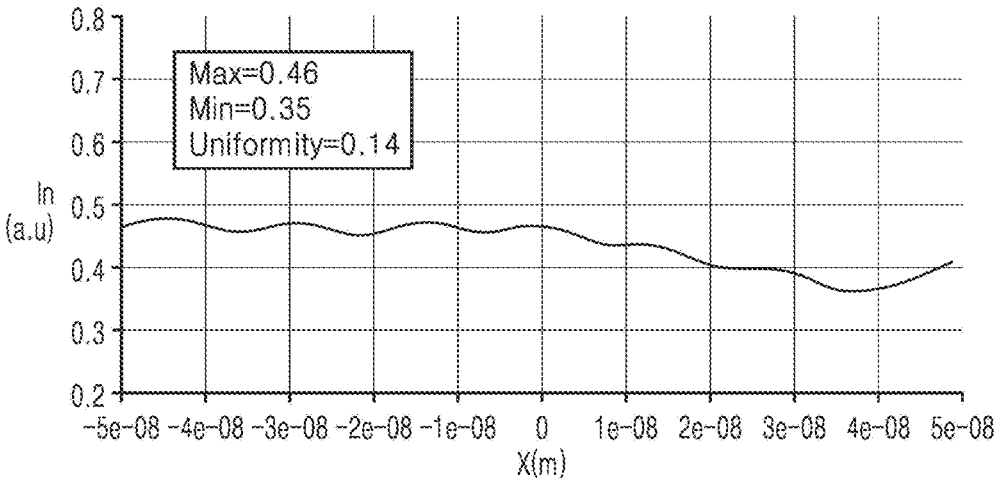
Figure 6C:
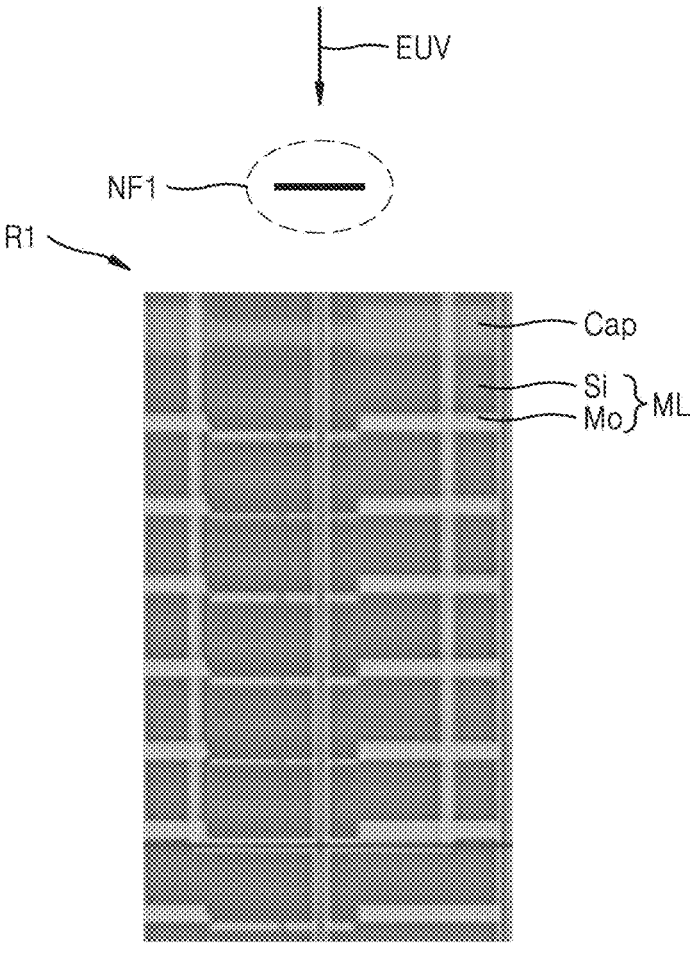
Figure 6D:
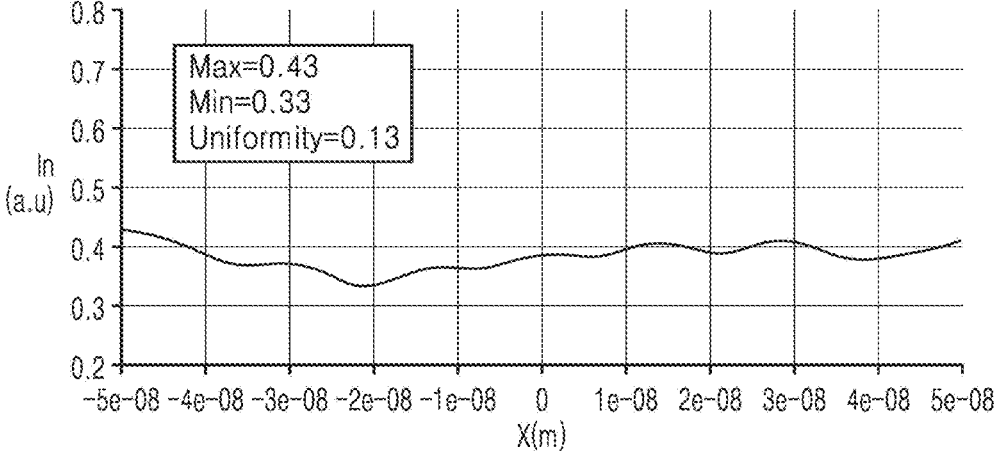

FIGS. 6A to 6D are graphs showing a first reticle having a surface roughness of 0.2 nm and an EUV light measurement result, a first reticle having a nano thin-film disposed thereon, and an EUV light measurement result. In the graphs of FIGS. 6B and 6D, an x-axis denotes a position in units of m, and a y-axis denotes an intensity in arbitrary unit (a.u.).

Referring to FIGS. 6A and 6B, a first reticle R1 may basically have a structure similar to that of the reference reticle RR shown in FIG. 5A. However, because the first reticle R1 has a surface roughness of 0.2 nm, as shown in FIG. 6A, there may be slight distortion in the multiple layer ML and the capping layer Cap.

FIG. 6B is an intensity graph obtained by irradiating the EUV light (EUV) onto the first reticle R1 of FIG. 6A and measuring the EUV light (EUV) reflected by the first reticle R1, and a uniformity value is slightly high about 0.14. That is, the EUV light reflected by the first reticle R1 may not have high uniformity. As a reference, when the uniformity value is less than 0.1, it is determined that the uniformity is excellent.

Referring to FIGS. 6C and 6D, as shown in FIG. 6C, with respect to the same first reticle R1, a first nano thin-film NF1 is disposed above the first reticle R1. Here, the first nano thin-film NF1 may have a thickness of about 1 nm. FIG. 6D is an intensity graph obtained by irradiating the EUV light (EUV) onto the first reticle R1 by using the first nano thin-film NF1 and measuring the EUV light (EUV) reflected by the first reticle R1, and the uniformity value of about 0.13 is shown. When the uniformity value is compared with that obtained when the first nano thin-film NF1 is not used, the uniformity value is decreased, and the uniformity of the EUV light reflected by the first reticle R1 is improved.

Figure 7A:
FIGS. 7A to 7D are graphs showing a second reticle having a surface roughness of 0.5 nm and an EUV light measurement result, a second reticle having a second nano thin-film disposed thereon, and an EUV light measurement result.
Figure 7A:
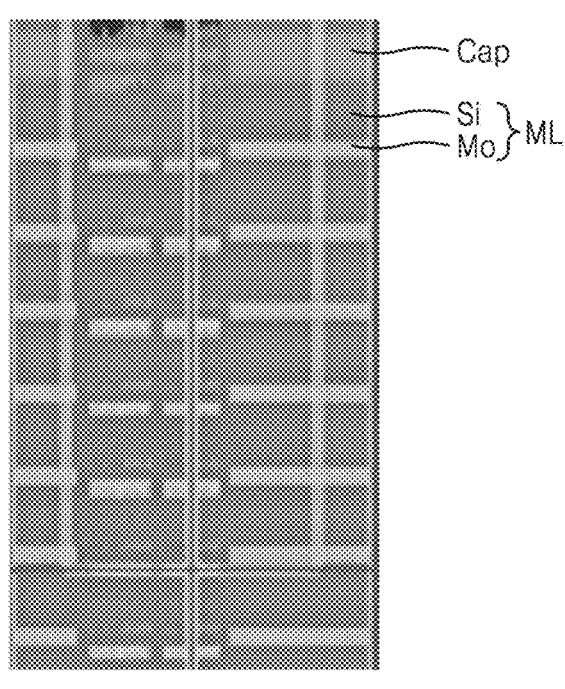
Figure 7B:
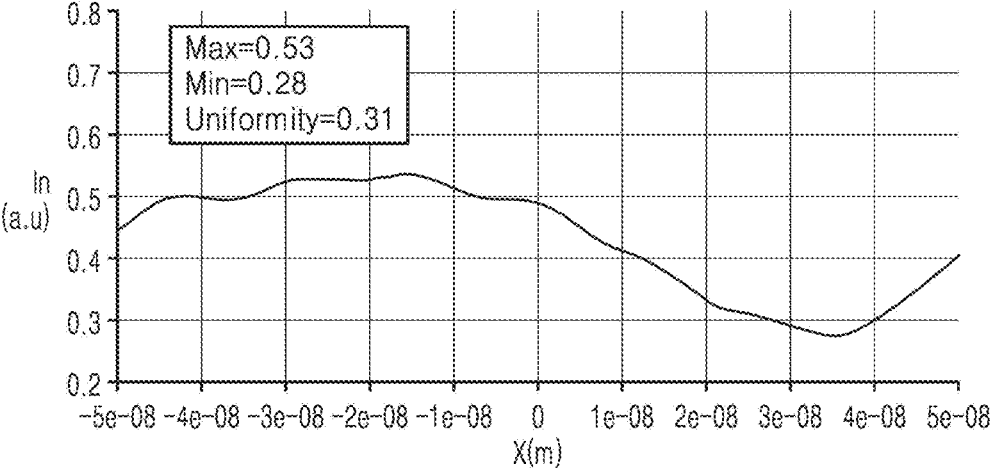
Figure 7C:
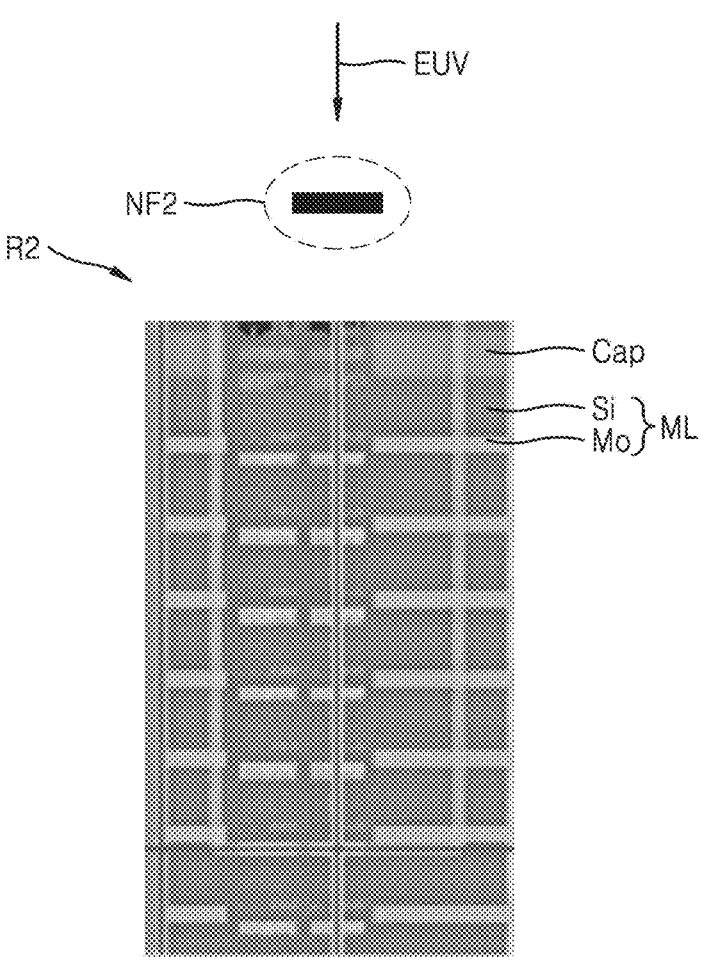
Figure 7D:
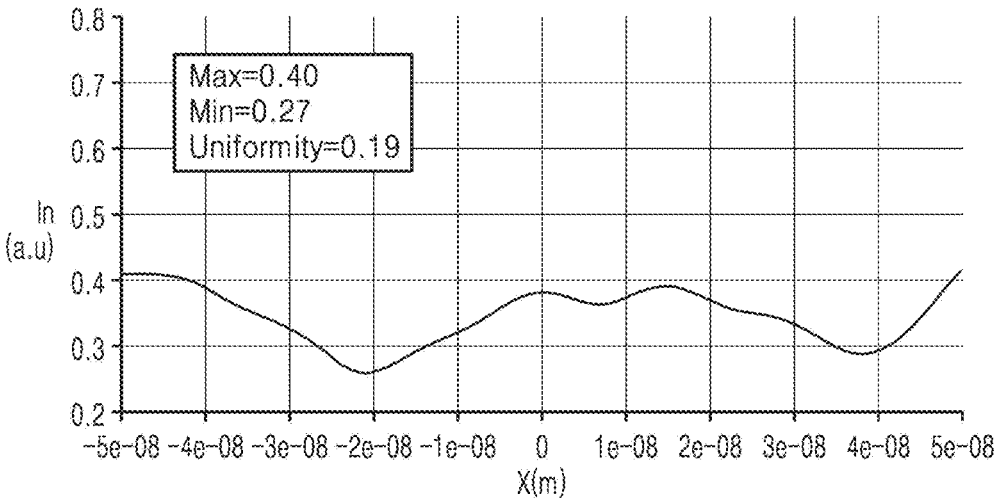

FIGS. 7A to 7D are graphs showing a second reticle having a surface roughness of 0.5 nm and an EUV light measurement result, a second reticle having a second nano thin-film disposed thereon, and an EUV light measurement result. In the graphs of FIGS. 7B and 7D, an x-axis denotes a position in units of m, and a y-axis denotes an intensity in arbitrary unit (a.u.).

Referring to FIGS. 7A and 7B, a second reticle R2 may basically have a structure similar to that of the reference reticle RR shown in FIG. 5A. However, because the second reticle R2 has a surface roughness of 0.5 nm, as shown in FIG. 7A, there may be severe distortion in the multiple layer ML and the capping layer Cap.

FIG. 7B is an intensity graph obtained by irradiating the EUV light (EUV) onto the second reticle R2 of FIG. 7A and measuring the EUV light (EUV) reflected by the second reticle R2, and a uniformity value is very high about 0.31. That is, it may be determined that the uniformity of the EUV light reflected by the second reticle R2 may be very bad.

Referring to FIGS. 7C and 7D, as shown in FIG. 7C, with respect to the same second reticle R2, a second nano thin-film NF2 is disposed above the second reticle R2. Here, the second nano thin-film NF2 may have a thickness of about 2 nm. FIG. 7D is an intensity graph obtained by irradiating the EUV light (EUV) onto the second reticle R2 by using the second nano thin-film NF2 and measuring the EUV light (EUV) reflected by the second reticle R2, and the uniformity value of about 0.19 is shown. When the uniformity value is compared with that obtained when the second nano thin-film NF2 is not used, the uniformity value is greatly decreased, and the uniformity of the EUV light reflected by the second reticle R2 is greatly improved. As the numerical comparison, because the uniformity value is reduced from 0.31 to 0.19, it may be identified that the uniformity is improved by about 40% (=0.12/0.31*100).

Figure 8A:
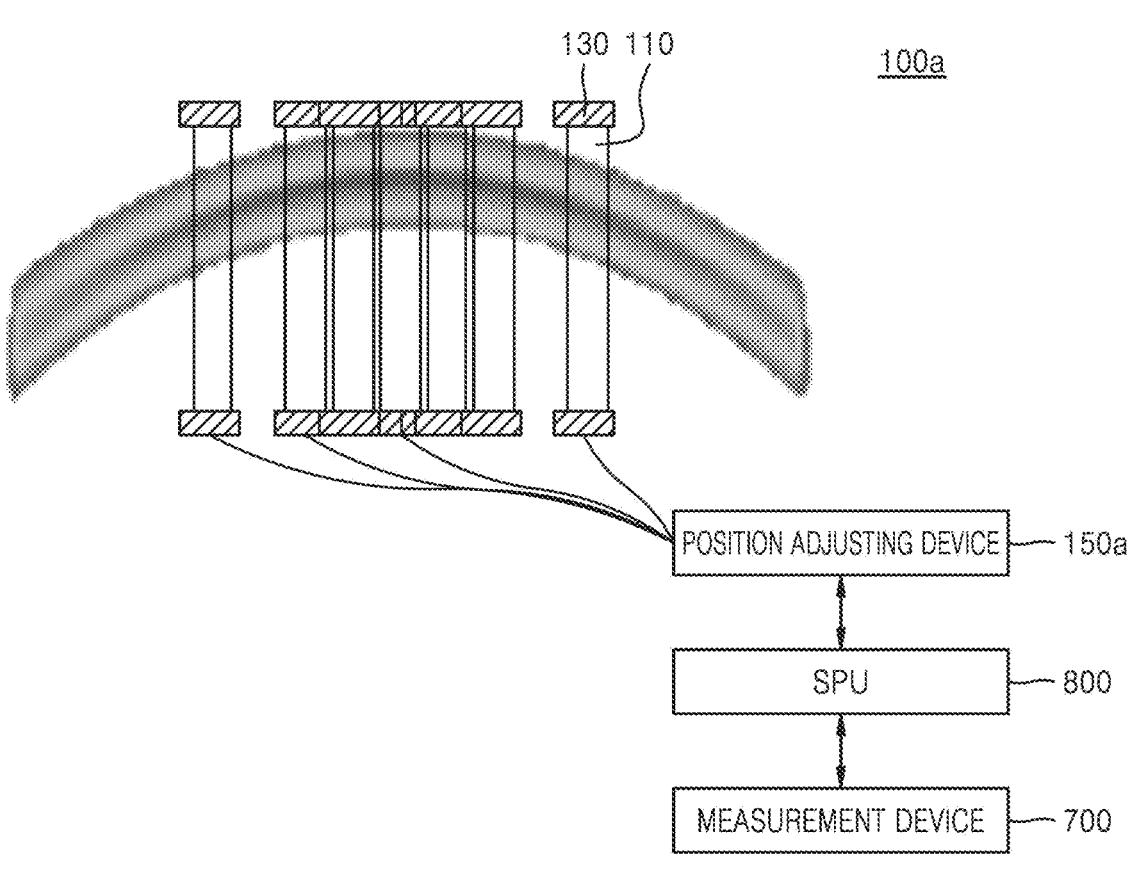
FIGS. 8A and 8B are conceptual diagrams for describing a method of adjusting uniformity of EUV light by using an EUV light uniformity control apparatus, according to the embodiments.
Figure 8B:
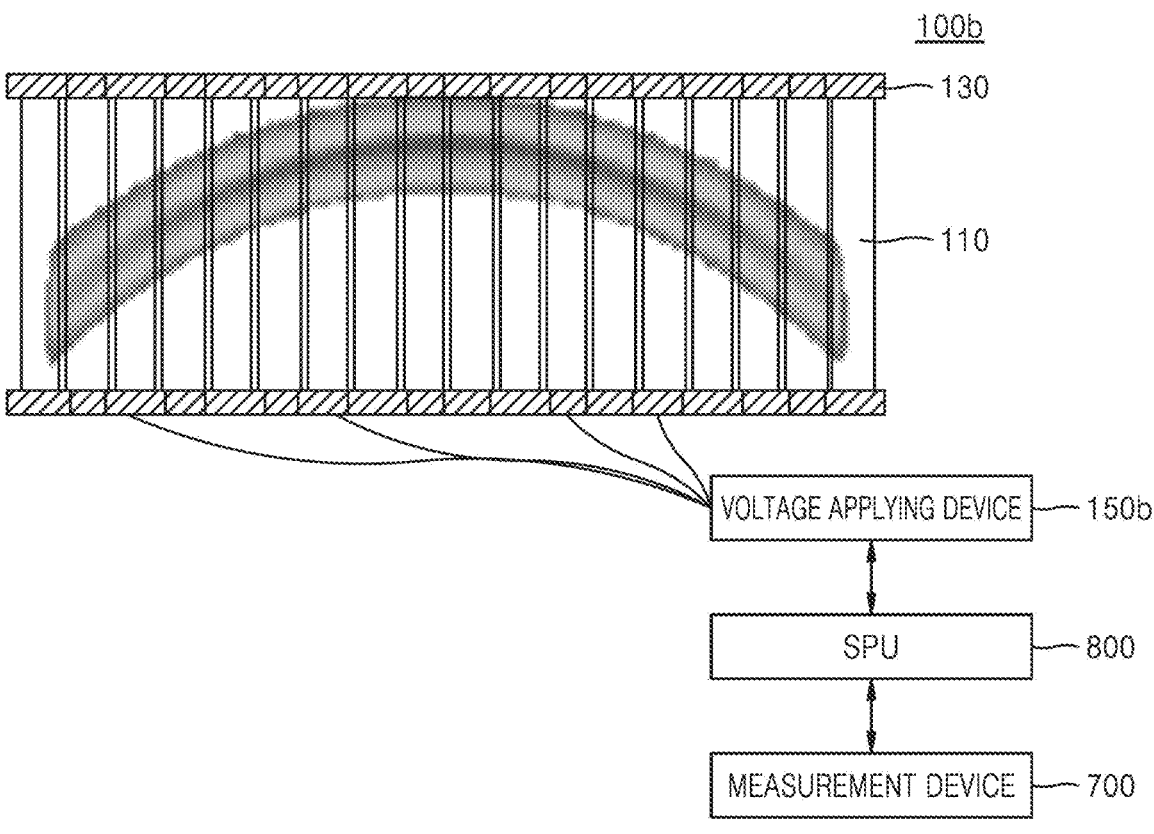

FIGS. 8A and 8B are conceptual diagrams for describing a method of adjusting uniformity of EUV light by using an EUV light uniformity control apparatus, according to the embodiments. Reference is additionally made to FIGS. 1 to 7D, but the descriptions already provided above with reference to and FIGS. 1 to 7D are briefly provided or omitted to avoid redundancy.

Referring to FIG. 8A, an EUV light uniformity control apparatus 100a of the embodiment may include the nano thin-films 110, the thin film mount 130, and a position adjusting device 150a. In the EUV light uniformity control apparatus 100a of the embodiment, each of the nano thin-films 100 may have a fixed transmittance. Also, the position adjusting device 150a may move the thin film mounts 130 so as to move the nano thin-films 110 having the required transmittance to a corresponding position under the reticle.

With respect to the measurement device 700 and the SPU 800, the operation of the position adjusting device 150a is described in more detail below. The measurement device 700 may measure an intensity of the EUV light on the wafer stage. The SPU 800 analyzes uniformity of the EUV light based on the intensity of the EUV light measured by the measurement device 700. Also, based on information regarding the uniformity of the EUV light, a transmittance required for the nano thin-film 110 of the EUV light uniformity control apparatus 100a is calculated. Also, the SPU 800 may transfer a control signal to the EUV light uniformity control apparatus 100a based on the transmittance. Here, the control signal may include a signal regarding position information of each nano thin-film 110. That is, the control signal may include information about the position under the reticle, where a nano thin-film 110 having the calculated transmittance is to be positioned. The position adjusting device 150a may move each nano thin-film 110 having the corresponding transmittance to the corresponding position under the reticle based on the control signal.

Referring to FIG. 8B, an EUV light uniformity control apparatus 100b of the embodiment may include the nano thin-films 110, the thin film mount 130, and a voltage applying device 150*b*. In the EUV light uniformity control apparatus 100*b* of the embodiment, each of the nano thin-films 110 may include a material of which the transmittance varies depending on the voltage. For example, the nano thin-films 110 may include graphene. However, the material included in the nano thin-films 110 is not limited to graphene. For example, the nano thin-films 110 may include another material of which the transmittance may vary depending on the voltage. Also, the nano thin-films 110 may include a material having a transmittance changed according to electromagnetic control, rather than the voltage. The voltage applying device 150*b* may change the transmittance of the nano thin-film 110 by applying and adjusting the voltage to each nano thin-film 110 at the corresponding position under the reticle via the thin film mount 130.

With respect to the measurement device 700 and the SPU 800, the operation of the voltage applying device 150*b* is described in more detail below. The measurement device 700 may measure an intensity of the EUV light on the wafer stage. The SPU 800 analyzes uniformity of the EUV light based on the intensity of the EUV light measured by the measurement device 700. Also, based on information regarding the uniformity of the EUV light, a transmittance required for the nano thin-film 110 of the EUV light uniformity control apparatus 100*b* is calculated. Also, the SPU 800 may transfer a control signal to the EUV light uniformity control apparatus 100*b* based on the transmittance. Here, the control signal may include a signal regarding a magnitude of the voltage to be applied to each nano thin-film 110. That is, the control signal may include information about a magnitude of the voltage that is necessary for each nano thin-film 110 at the corresponding position under the reticle to have the calculated transmittance. The voltage applying device 150*b* may apply the voltage of a certain magnitude to the nano thin-film 110 at the corresponding position under the reticle based on the control signal, so that each nano thin-film 110 may have the calculated transmittance.

Figure 9:
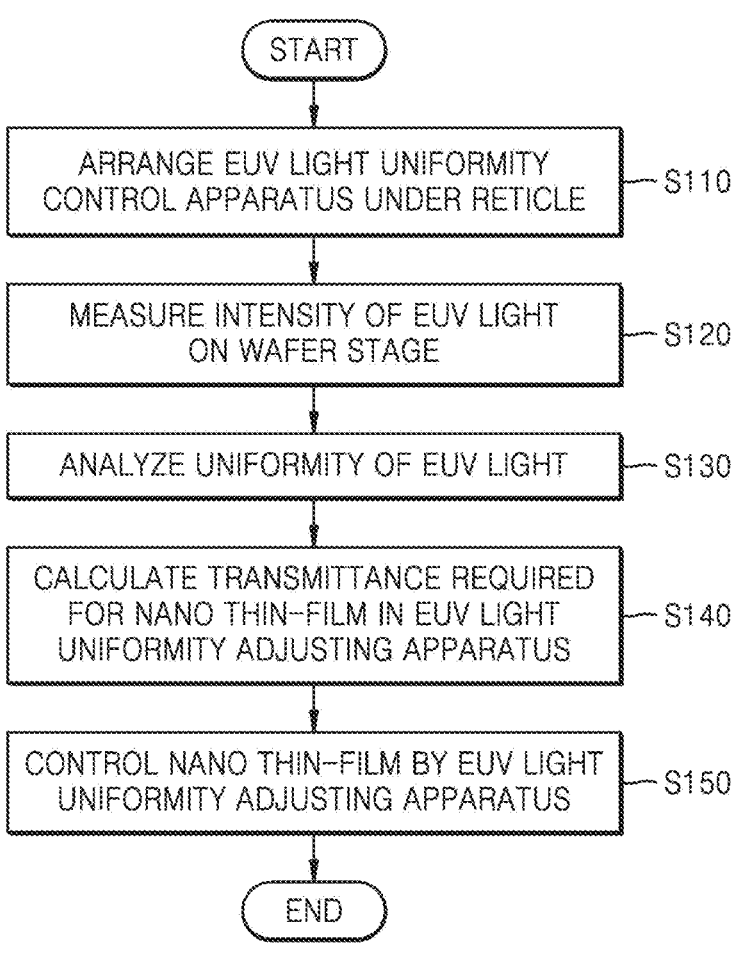
FIG. 9 is a flowchart schematically illustrating processes in the method of controlling EUV light uniformity by using an EUV light uniformity control apparatus, according to an embodiment.

FIG. 9 is a flowchart schematically illustrating processes in the method of controlling EUV light uniformity by using an EUV light uniformity control apparatus according to an embodiment. Reference is also made to FIG. 1 to FIG. 8A, but the descriptions already provided above with reference to FIGS. 1 to 8B are briefly provided or omitted to avoid redundancy.

Referring to FIG. 9, the EUV light uniformity control method using the EUV light uniformity control apparatus according to the embodiment (hereinafter, referred to as 'EUV light uniformity control method') includes arranging the EUV light uniformity control apparatus 100 under the reticle R in the EUV exposure equipment 1000 (S110). Here, the EUV light uniformity control apparatus 100 may be the EUV light uniformity control apparatus 100 shown in FIG. 2A. Therefore, the EUV light uniformity control apparatus 100 may include a nano thin-film 110, a thin film mount 130, and a thin film control device 150. Also, the thin film control device 150 may include, for example, the position adjusting device 150*a* in the EUV light uniformity control apparatus 100*a* shown in FIG. 8A or the voltage applying device 150*b* in the EUV light uniformity control apparatus 100*b* shown in FIG. 8B.

After that, the intensity of the EUV light is measured on the wafer stage 600 on which the wafer W is disposed (S120). The intensity of the EUV light may be measured by using the measurement device 700. Also, the intensity of the EUV light may be measured at a position corresponding to the region on the wafer W, to which the EUV light of the curved slit shape is projected.

After measuring the intensity of the EUV light, the uniformity of the EUV light is analyzed based on the intensity of the EUV light (S130). That is, the uniformity of the EUV light in the region on the wafer W, to which the EUV light of the curved slit shape is projected, is analyzed. The analysis of the EUV light uniformity may be carried out by the SPU 800.

In addition, the SPU 800 calculates the transmittance required of each nano thin-film 110 at a certain position under the reticle R, based on the uniformity information (S140). Here, the certain position under the reticle R may denote a position where the adjustment in the uniformity is required. In detailed example, in the analysis of the EUV light uniformity, when the intensity in a first portion in the region on the wafer W is high, the lower portion of the reticle R, which corresponds to the first portion, may correspond to the certain position. Also, the transmittance may be required of a nano thin-film 110 at the certain position, in order to improve the uniformity of the EUV light in the region on the wafer W. For example, when the intensity of the first portion in the region on the wafer is high, in order to decrease the intensity of the first portion to be similar to the other peripheral regions, the transmittance required to the nano thin-film 110 at the certain position under the reticle R may be calculated.

After that, based on the information of the transmittance, the EUV light uniformity control apparatus 100 controls the nano thin-film 110 (S150). In detail, the SPU 800 transfers the control signal to the thin film control device 150 of the EUV light uniformity control apparatus 100 based on the information of the transmittance, and the thin film control device 150 controls each nano thin-film 110 based on the control signal. For example, when the thin film control device 150 includes the position adjusting device 150*a*, the SPU 800 transfers a signal regarding the position information of each nano thin-film 110 having the calculated transmittance to the position adjusting device 150*a* as the control signal, and the position adjusting device 150*a* may move each nano thin-film 110 having the corresponding transmittance to the corresponding position under the reticle R. When the thin film control device 150 includes the voltage applying device 150*b*, the SPU 800 transfers information about the magnitude of the voltage that allows each nano thin-film 110 at the corresponding position under the reticle R to have the calculated transmittance to the voltage applying device 150*b* as the control signal, and the voltage applying device 150*b* applies the voltage of a certain magnitude to each nano thin-film 110 at the corresponding position under the reticle so that each nano thin-film 110 may have the calculated transmittance.

Figure 10:
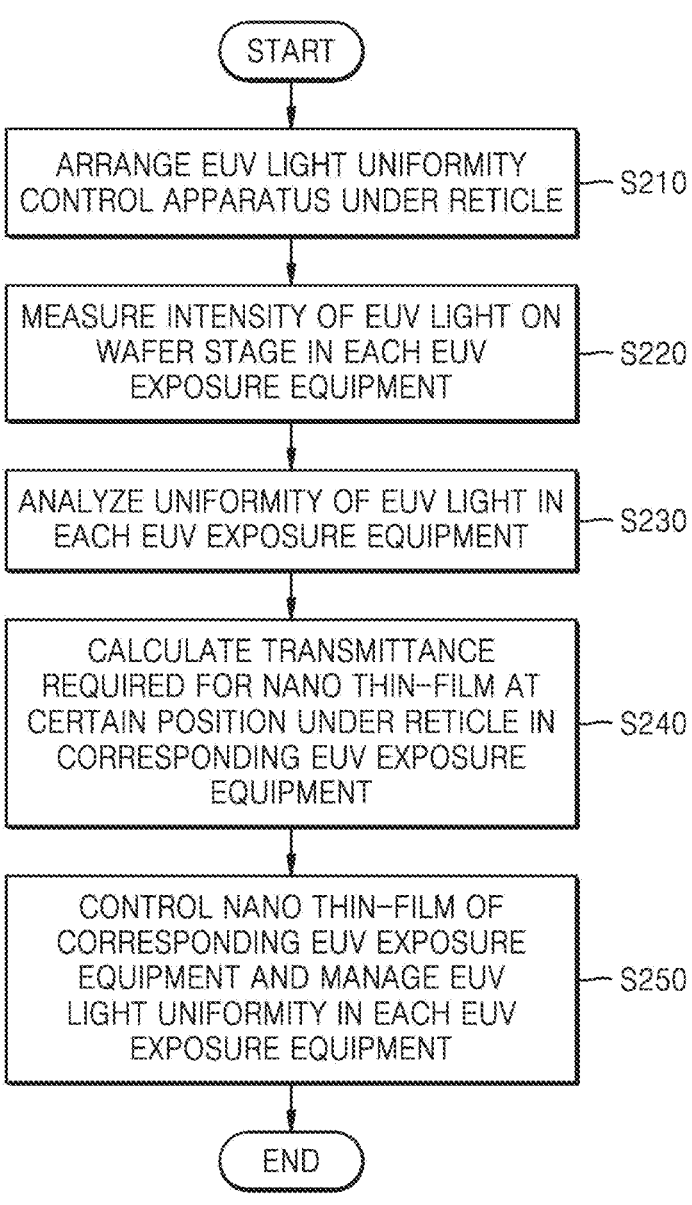
FIG. 10 is a flowchart schematically illustrating processes in the method of controlling EUV light uniformity by using an EUV light uniformity control apparatus, according to an embodiment.

FIG. 10 is a flowchart schematically illustrating processes in the method of controlling EUV light uniformity by using an EUV light uniformity control apparatus according to an embodiment. Reference also made to FIG. 1 to FIG. 9, and descriptions already provided above with reference to FIGS. 1 to 9 are briefly provided or omitted to avoid redundancy.

Referring to FIG. 10, the EUV light uniformity control method using the EUV light uniformity control apparatus according to the embodiment (hereinafter, simply referred to as 'EUV light uniformity control method') may be applied to a plurality pieces of EUV exposure equipment 1000. First, the EUV light uniformity control apparatus 100 is disposed under the reticle R in each of the pieces of EUV exposure equipment 1000 (S210). After that, the intensity of the EUV light is measured on the wafer stage 600 on which the wafer W of each EUV exposure equipment 1000 is disposed (S220). After measuring the intensity of the EUV light, the uniformity of the EUV light is analyzed based on the intensity of the EUV light in each EUV exposure equipment 1000 (S230). In addition, based on the uniformity information, the transmittance required for each nano thin-film 110 at a certain position under the reticle R of the corresponding EUV exposure equipment 1000 is calculated (S240). After that, based on the information about the transmittance, the EUV light uniformity control apparatus 100 under the reticle R in the corresponding EUV exposure equipment 1000 controls the nano thin-films 110 (S250). Also, based on the transmittance information, the EUV light uniformity of each EUV exposure equipment 1000 is managed.

While the inventive concept has been particularly shown and described with reference to embodiments thereof, it will be understood that various changes in form and details may be made therein without departing from the spirit and scope of the following claims.

What is claimed is:

1. An extreme ultraviolet (EUV) light uniformity control apparatus comprising:
    a plurality of nano thin-films each having a band shape extending in a first direction that is a scanning direction of EUV exposure equipment and linearly arranged under a reticle of the EUV exposure equipment in a second direction that is perpendicular to the first direction;
    thin film mounts fixing the plurality of nano thin-films on two opposite sides in the first direction; and
    a thin film control device connected to the thin film mounts and configured to control the plurality of nano thin-films,
    wherein EUV light from the EUV exposure equipment is projected onto a wafer that is an exposure target, after passing through the plurality of nano thin-films twice by being incident to and reflected from the reticle, and
    wherein the thin film control device is configured to adjust a uniformity of the EUV light projected on the wafer.

2. The EUV light uniformity control apparatus of claim 1, wherein each of the plurality of nano thin-films has a transmittance of about 80% to about 99%, and
    wherein the thin film control device is configured to implement a transmittance of less than 80% by overlapping at least two nano thin-films of the plurality of nano thin-films.

3. The EUV light uniformity control apparatus of claim 1, wherein each of the plurality of nano thin-films has a width of about 1 to about 15 mm in the second direction and a width of about 40 to about 100 mm in the first direction.

4. The EUV light uniformity control apparatus of claim 1, wherein each of the plurality of nano thin-films includes one of silicon (Si), silicon carbide (SIC), silicon nitride (SiNx), and a carbon-based material.

5. The EUV light uniformity control apparatus of claim 1, wherein the thin film control device includes a position adjusting device for moving the thin film mounts, and
    the thin film control device is configured to control a position of each of the plurality of nano thin-films by moving each of the thin film mounts in at least one of the first direction or the second direction.

6. The EUV light uniformity control apparatus of claim 5, wherein the thin film control device is configured to move at least two nano thin-films of the plurality of nano thin-films along the first direction so as to overlap each other.

7. The EUV light uniformity control apparatus of claim 1, wherein each of the plurality of nano thin-films includes a material having a transmittance that changes according to a voltage,
    the thin film control device includes a voltage applying device that is configured to apply a voltage to each of the plurality of nano thin-films via the thin film mounts, and
    the thin film control device is configured to control a transmittance of each of the plurality of nano thin-films by adjusting the voltage applied to the nano thin-film.

8. The EUV light uniformity control apparatus of claim 1, wherein each of the thin film mounts includes a cooling device.

9. The EUV light uniformity control apparatus of claim 1, wherein the thin film mounts fix each of the plurality of nano thin-films on two opposite sides in the first direction.

10. Extreme ultraviolet (EUV) exposure equipment comprising:
    an EUV source configured to generate and emit EUV light;
    a first optical system configured to transfer the EUV light from the EUV source to be incident on a reticle;
    a reticle stage on which the reticle is disposed;
    a second optical system configured to transfer the EUV light reflected by the reticle to a wafer that is an exposure target; and
    an EUV light uniformity control apparatus that is disposed under the reticle, that includes nano thin-films through which the EUV light passes, and that is configured to adjust the EUV light projected on the wafer,
    wherein the EUV light uniformity control apparatus comprises thin film mounts fixing each of the nano thin-films on two opposite sides in a first direction.

11. The EUV exposure equipment of claim 10, wherein each of the nano thin-films has a band shape extending in the first direction, wherein the first direction is a scanning direction of the EUV exposure equipment, wherein the nano thin-films are linearly arranged under the reticle in a second direction that is perpendicular to the first direction, and wherein the EUV light uniformity control apparatus comprises:
    a thin film control device connected to the thin film mounts and configured to control the nano thin-films,
    wherein the EUV light uniformity control apparatus is configured such that the EUV light is projected onto the wafer, after passing through the nano thin-films twice by being incident on and reflected from the reticle, and
    wherein the EUV light uniformity control apparatus is configured to adjust the EUV light projected on the wafer to be uniform by using the thin film control device.

12. The EUV exposure equipment of claim 11, wherein each of the nano thin-films has a transmittance of about 80% to about 99%, and
    wherein the thin film control device is configured to implement a transmittance less than 80% by overlaying at least two nano thin-films of the nano thin-films.

13. The EUV exposure equipment of claim 11, wherein each of the nano thin-films includes one of silicon (Si), silicon carbide (SiC), silicon nitride (SiNx), and a carbon-based material.

14. The EUV exposure equipment of claim 11, wherein the thin film control device includes a position adjusting device for moving the thin film mounts, and the thin film control device is configured to control a position of each of the nano thin-films by moving the thin film mounts in at least one of the first direction or the second direction.

15. The EUV exposure equipment of claim 11, wherein each of the nano thin-films includes a material having a transmittance that changes according to a voltage, the thin film control device includes a voltage applying device configured to apply a voltage to each of the nano thin-films via the thin film mounts, and the thin film control device is configured to control a transmittance of each of the nano thin-films by adjusting the voltage applied to the nano thin-film.

16. The EUV exposure equipment of claim 11, further comprising:

a measurement device for measuring an intensity of the EUV light on a wafer stage on which the wafer is disposed; and a signal processing unit configured to:

calculate a uniformity of the EUV light on the wafer and a transmittance for each of the nano thin-films at a certain position under the reticle based on the intensity, and transfer a control signal to the thin film control device based on the transmittance for each of the nano thin-films.

17. The EUV exposure equipment of claim 16, wherein the signal processing unit is configured to, for each EUV exposure equipment of a plurality of the EUV exposure equipment:

analyze a uniformity of EUV light generated by the EUV exposure equipment, control nano thin-films in the EUV exposure equipment based on the uniformity of the EUV light generated by the EUV exposure equipment, and manage the uniformity of the EUV light generated by the EUV exposure equipment.

18. Extreme ultraviolet (EUV) exposure equipment comprising:

an EUV source configured to generate and emit EUV light;

a first optical system configured to transfer the EUV light from the EUV source to be incident to a reticle;

a reticle stage on which the reticle is disposed;

a second optical system configured to transfer the EUV light reflected by the reticle to a wafer that is an exposure target;

a wafer stage on which the wafer is disposed; and an EUV light uniformity control apparatus disposed under the reticle and configured to adjust a uniformity of the EUV light on the wafer, wherein the EUV light uniformity control apparatus comprises:

a plurality of nano thin-films each having a band shape extending in a first direction that is a scanning direction of the EUV exposure equipment and linearly arranged under the reticle in a second direction that is perpendicular to the first direction;

thin film mounts fixing each of the plurality of nano thin-films on two opposite sides in the first direction; and a thin film control device connected to the thin film mounts and configured to control the plurality of nano thin-films, wherein;

the EUV light is projected onto the wafer, after passing through the nano thin-films twice by being incident on and reflected from the reticle, the EUV light uniformity control apparatus is configured to adjust the EUV light to be uniform by using the thin film control device, the EUV light being projected on the wafer, and the thin film control device comprises at least one of a position adjusting device configured to move the thin film mounts or a voltage applying device configured to apply voltages to the plurality of nano thin-films via the thin film mounts.

19. The EUV exposure equipment of claim 18, wherein the thin film control device includes the position adjusting device, and the position adjusting device is configured to move at least two nano thin-films of the plurality of nano thin-films along the first direction so as to overlap each other.

20. The EUV exposure equipment of claim 18, wherein each of the plurality of nano thin-films includes a material having a transmittance that changes is according to a voltage, the thin film control device includes the voltage applying device, and the voltage applying device is configured to change a transmittance of each of the plurality of nano thin-films by adjusting a voltage applied to the nano thin-film.

* * * * *